(12) United States Patent
Buelow et al.

(10) Patent No.: US 10,998,913 B2
(45) Date of Patent: May 4, 2021

(54) SWITCHING CIRCUIT FOR CHECKING AN ANALOG INPUT CIRCUIT OF AN A/D CONVERTER

(71) Applicant: WAGO Verwaltungsgesellschaft mit beschraenkter Haftung, Minden (DE)

(72) Inventors: Alexander Buelow, Stadthagen (DE); Christian Voss, Minden (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 0 days.

(21) Appl. No.: 16/832,592

(22) Filed: Mar. 27, 2020

(65) Prior Publication Data

US 2020/0228130 A1 Jul. 16, 2020

Related U.S. Application Data

(63) Continuation of application No. PCT/IB2018/001083, filed on Sep. 21, 2018.

(30) Foreign Application Priority Data

Sep. 29, 2017 (DE) .................... 10 2017 009 088.2

(51) Int. Cl.
*H03M 1/10* (2006.01)

(52) U.S. Cl.
CPC ......... *H03M 1/109* (2013.01); *H03M 1/1076* (2013.01)

(58) Field of Classification Search
CPC .... H03M 1/109; H03M 1/1076; H01L 27/026
USPC ................................. 341/118–155
See application file for complete search history.

(56) References Cited

U.S. PATENT DOCUMENTS

| 5,412,385 | A  |    | 5/1995  | Mangelsdorf |            |
|-----------|----|----|---------|-------------|------------|
| 6,067,035 | A  |    | 5/2000  | Kosak et al.|            |
| 8,471,738 | B2 |    | 6/2013  | Kehl        |            |
| 8,947,276 | B1 |    | 2/2015  | Yu et al.   |            |
| 2003/0222273 | A1 | * | 12/2003 | Kunz ...................... H01L 29/87 |
|           |    |    |         |             | 257/119    |
| 2004/0212936 | A1 | * | 10/2004 | Sailing ................ H01L 27/0277 |
|           |    |    |         |             | 361/56     |
| 2016/0173081 | A1 | * | 6/2016  | Pan .................. H03K 19/01852 |
|           |    |    |         |             | 361/56     |
| 2018/0224873 | A1 | * | 8/2018  | Motz .................. G01R 19/1659 |

* cited by examiner

FOREIGN PATENT DOCUMENTS

| DE | 196 31 972 A1 | 2/1998 |
| DE | 103 20 717 A1 | 12/2004 |
| DE | 10 2010 029 497 A1 | 12/2011 |

*Primary Examiner* — Lam T Mai
(74) *Attorney, Agent, or Firm* — Muncy, Geissler, Olds & Lowe, P.C.

(57) ABSTRACT

A switching circuit for checking an analog input circuit of an A/D converter is shown. The switching circuit comprises the analog circuit and a comparator circuit. The analog input circuit is configured to generate a first derived signal S1 and a second derived signal S2 from an analog input signal SE of the analog input circuit. The first derived signal S1 and the second derived signal S2 are input signals for the comparator circuit, but only the first derived signal S1 is an input signal for the A/D converter. The comparator circuit is configured to check whether a deviation of the derived signals S1, S2 from each other lies within a tolerance range TOL and to output an output signal SA depending on the check, which may be further evaluated.

14 Claims, 8 Drawing Sheets

SWITCHING CIRCUIT FOR CHECKING AN ANALOG INPUT CIRCUIT OF AN A/D CONVERTER

This nonprovisional application is a continuation of International Application No. PCT/IB2018/001083, which was filed on Sep. 21, 2018, and which claims priority to German Patent Application No. 10 2017 009 088.2, which was filed in Germany on Sep. 29, 2017, and which are both herein incorporated by reference.

BACKGROUND OF THE INVENTION

Field of the Invention

The present invention relates to a switching circuit for checking an analog input circuit of an A/D converter.

Description of the Background Art

Failsafe input/output modules (F-I/O modules), which come under Category 4 of DIN EN ISO 13849, or which have a risk-reducing function according to DIN EN 61508 and DIN EN 61511, typically have redundant transmission channels. The inputs and outputs as well as the microcontrollers in F-I/O modules of this type therefore often have a dual design, whereby faulty transmission channels may be detected on the module side with the aid of checking circuits and by comparing the signals transmitted via the transmission channels.

Failsafe analog inputs are aimed at the failsafe detection of analog input variables, each input variable is typically preprocessed in an analog manner, and the resulting voltage, which may be, for example, proportionate to the input variable, is subsequently digitized and forwarded to a microprocessor. The microprocessor may then carry out the further processing, for example applying calibration data to the digitized input variable, and generate a process value, which, in turn, is transmitted to a higher-level controller. The controller may subsequently use the process value for controlling an application-specific process.

It may be necessary to transfer a defined process value to the controller even if the function of an analog input is no longer performed. To ensure this, however, it may be necessary to monitor the operation of the components of the failsafe I/O module during operation, so that the I/O module may take on a defined state in the case of a malfunction.

An A/D converter device with error correction is known from U.S. Pat. No. 5,412,385 A. An analog input signal is converted with the aid of an A/D converter, and the resulting digital signal is converted by a D/A converter into an analog signal, which is subtracted from the analog input signal. The difference signal is then amplified, re-converted and used to improve the accuracy of the digital signal generated by the A/D converter.

A circuit arrangement and a method for checking the plausibility of the proper operation of an A/D converter designed for safety-related applications are known from DE 103 20 717 A1. An A/D converter which provides a digital signal from an analog input signal, a control unit which provides a reference signal from the analog input signal, a comparison unit, which includes a comparator and compares the analog input signal with the reference signal and outputs a comparison signal as a function thereof, an evaluation unit which ascertains a difference signal by comparing the digital signal and the comparison signal and which outputs an error signal if the difference signal exceeds a predefined threshold value, are used.

A method for testing A/D converters is known from U.S. Pat. No. 8,947,276 B1. A converted signal is compared with a reference signal, and the deviation between the signals is analyzed.

A method is known from DE 10 2010 029 497 A1, which corresponds to U.S. Pat. No. 8,471,738, for detecting errors of an A/D converter, which is designed to convert an analog input signal into a digital output signal, it being provided that the digital output signal represents a number z, which results from an input value Uin of the analog input signal when an A/D conversion is carried out, in the method a value range for all possible numbers z being divided into subranges, and a value range for all possible input values Uin being divided into subranges, and an input value Uin and a number z corresponding thereto being assigned in each case to subregions corresponding to each other. In the method, a check is made as to which subrange an input value Uin to be converted is assigned, and to which subrange a number z ascertained by the A/D converter is assigned, an error being detected if the number z and the input value Uin are assigned to subranges which do not correspond to each other.

SUMMARY OF THE INVENTION

It is therefore an object of the present invention to provide a switching circuit that is configured to derive two signals from an analog input variable for the purpose of checking an analog input circuit of an A/D converter and to process the two signals spatially separated from each other, so that they are independent of each other with regard to faults (such as potential differences or EMC interference) and with regard to processing errors triggered by defective elements. After the preprocessing, the two signals may then be compared with each other to check the preprocessing.

For this purpose, a switching circuit according to the invention for checking an analog input circuit of an A/D converter comprises the input circuit and a comparator circuit, the analog input circuit being configured to generate a first derived signal and a second derived signal from an analog input signal of the analog input circuit, only the first derived signal being an input signal for the A/D converter, the first derived signal and the second derived signal being input signals for the comparator circuit, the comparator circuit being configured to check whether a deviation of the derived signals from each other lies within a tolerance range, and to output an output signal depending on the check, which may be further evaluated.

The terms "switching circuit" and circuit," as used in the description and the claims, can be understood to be, for example, an assembly of electrical and/or electronic components to form a functional arrangement. The comparison may furthermore take place in the comparison circuit, based on hardware or software as well as based on analog or digital signals. For example, the comparison may take place with the aid of a comparator or a microcontroller, and the microcontroller or an analog-to-digital converter connected upstream from the microcontroller may digitize the first derived signal and the second derived signal prior to the conversion. The check of whether the deviation of the derived signals from each other lies within a tolerance range may also take place by subtraction but also with the aid of other mathematical operations, such as a summation, distribution on a percentage basis, and the like, which permit a comparison of the derived signals.

In addition, the term "signal," as used in the description and the claims, can be understood to be, for example, an electrical signal, such as a voltage, a defined voltage range or a determined voltage characteristic. Moreover, the term "derived signal," as used in the description and the claims, can be understood to be, for example, a signal which may be calculated with the aid of a calculation specification (for example, a constant function) from the signal from which it is derived.

The switching circuit can include a switching element, it being possible to change or deactivate the second signal in a targeted manner by closing or opening the switching element in order to generate a defined error state.

The term "switching element," as used in the description and the claims, can be understood to be, for example, a component which is configured to interrupt an electrical connection, via which the signal may be or is transmitted (e.g. a transistor). Furthermore, the term "error state," as used in the description and the claims, can be understood to be, for example, a state which, when not actively generated, renders obvious a malfunction of the circuit or a malfunction of circuit elements. Moreover, the term "defined error state," as used in the description and the claims, can be understood to be, for example, a state which may be actively generated and makes it possible to check whether the state rendering a malfunction obvious is detected.

The comparison circuit can be configured to derive a difference signal from the first derived signal and the second derived signal, the tolerance range specifying a value range for the difference signal.

The term "difference signal," as used in the description and the claims, can be understood to be, for example, a voltage difference.

The analog input circuit is preferably configured to derive the first derived signal from a voltage drop at a first resistor and to derive the second derived signal from a voltage drop at a second resistor, the first resistor and the second resister being connected in series to an analog input of the input circuit.

The analog input circuit can include a first amplifier and a second amplifier, the first derived signal being an output signal of the first amplifier, and the second derived signal being an output signal of the second amplifier.

A system of two of the aforementioned switching circuits can comprise a first switching circuit and a second switching circuit, the first switching circuit comprising a first selection circuit, and the second switching circuit comprising a second selection circuit, the first selection circuit being configured to transmit the first derived signal of the first switching circuit or the first derived signal of the second switching circuit to the A/D converter of the first switching circuit, the second selection circuit being configured to transmit the first derived signal of the first switching signal or the first derived signal of the second switching circuit to the A/D converter of the second switching circuit, the system being further configured to check whether the signals digitized by the A/D converters are identical or whether a deviation of the digitized signals from each other lies within an acceptance range when the selection circuits transmit the first derived signal of the first switching circuit or the first derived signal of the second switching circuit to the A/D converters.

A method according to the invention for digitizing a signal received at an analog input comprises a derivation of a first signal from the signal received by the analog input, a derivation of a second signal from the signal received at the analog input, an amplification of the first signal, an amplification of the second signal, a digitization of the amplified first signal, a check of whether an expected dependency of the amplified signals resulting from the derivation of the first signal and the derivation of the second signal from the received signal is present, taking a tolerance range into account, and if the dependency of the amplified signals is not present, a generation of an error signal.

The term "error signal," as used in the description and the claims, can be understood to be, for example, an electrical signal (e.g. a bivalent signal), which signals an error and either results in an indication of the error or triggers a routine for overcoming the error.

The method furthermore preferably comprises an amplification of a third signal, which is independent of the signal received at the analog input or is generated by means of a targeted modification of the derivation of the second signal, and a check of whether a deviation between the amplified first signal and the amplified third signal lies outside the tolerance range.

The method also can comprise a generation of the error signal if the deviation between the amplified first signal and the amplified third signal lies within the tolerance range.

In addition, the method preferably comprises a derivation of a difference signal from the amplified first signal and the amplified second signal, the tolerance range specifying a value range for the difference signal.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
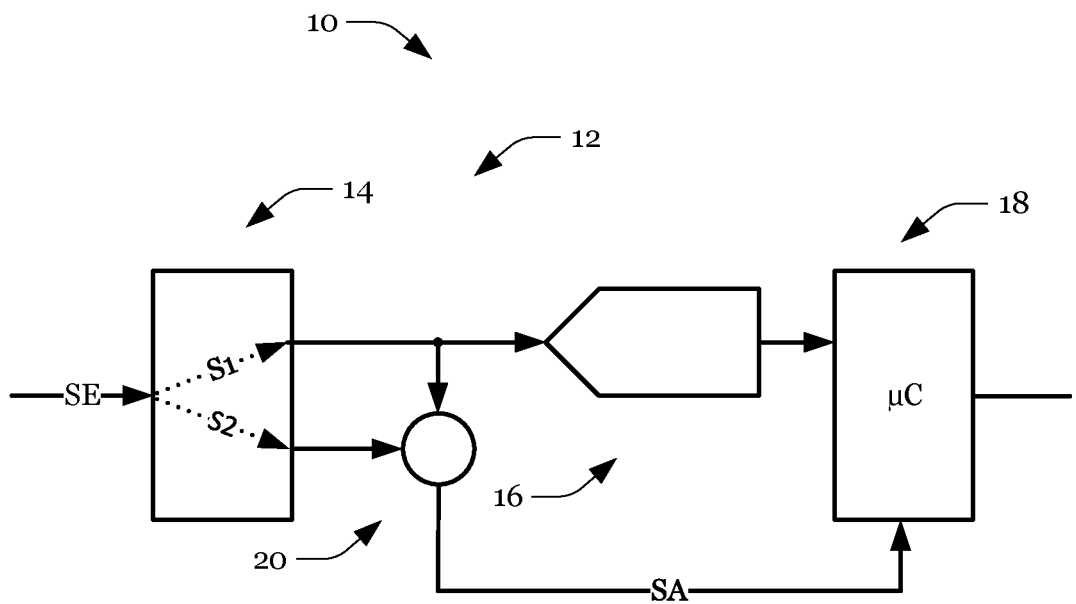
FIG. 1 shows an example of a circuit, including a switching circuit for checking an analog input circuit of an A/D converter.

FIG. 1 shows a circuit 10 comprising a switching circuit 12 for checking an analog input circuit 14 of an analog-to-digital converter 16 (A/D converter), which may be provided in a failsafe I/O module for controlling a process or a system. As illustrated in FIG. 1, analog input circuit 14 derives a first signal S1 and a second signal S2 from input signal SE. First signal S1 is digitized by A/D converter 16 and read in by a microcontroller 18.

To check analog input circuit 14, first signal S1 and second signal S2 are processed by a comparator circuit 20, which monitors whether a deviation of derived signals S1, S2 from each other lies within a tolerance range TOL. Based on the results of the check, an output signal SA may be generated, which may be further evaluated, for example, by microcontroller 18 or a higher-level controller (not illustrated).

Figure 1A:
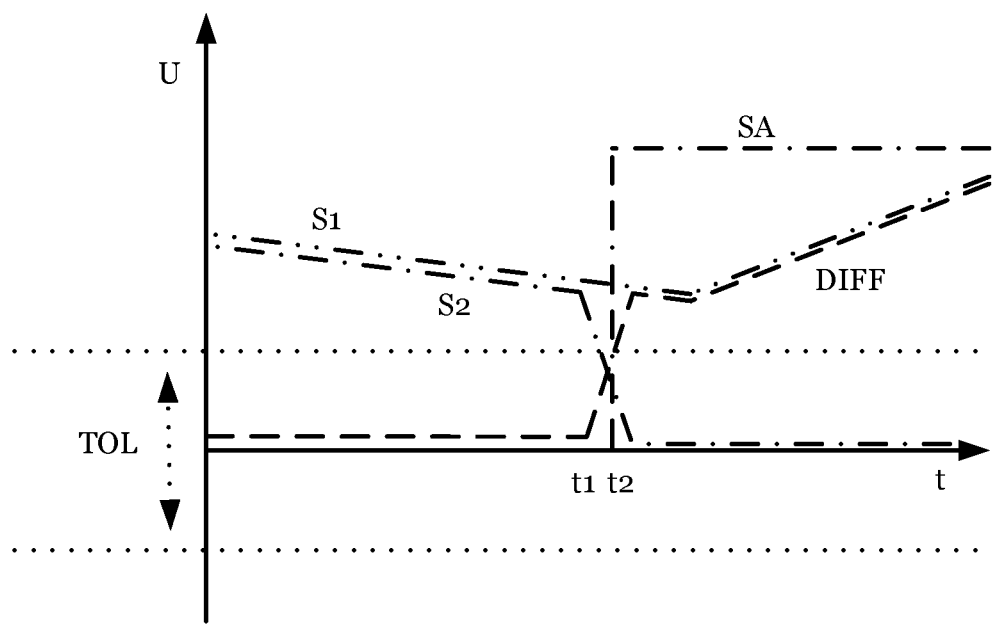
FIG. 1a shows examples of voltage characteristics in the circuit illustrated in FIG. 1.

FIG. 1a shows examples of characteristics for the voltages representing the signals. The voltages representing first signal S1 and second signal S2 are approximately the same size at point in time t1, so that differential voltage DIFF initially lies within tolerance range TOL (delimited by the dotted lines). Starting at point in time t1, the voltage representing second signal S2 no longer runs in parallel to the voltage representing first signal S1. As a result, differential voltage DIFF lies outside tolerance range TOL starting at point in time t2. Since differential voltage DIFF lies outside tolerance range TOL starting at point in time t2, the level of output signal SA changes (as shown in FIG. 1a, for example, from "low" to high" or alternatively from "high" to "low").

Output signal SA may be sampled by microcontroller 18, which infers a defect or a fault in analog input circuit 14 based on the deviation of signals S1, S2 from each other (i.e. if differential voltage DIFF lies outside tolerance range TOL). Output signal SA indicating the defect or fault may then initiate a processing routine in microcontroller 18 and cause an error signal SF to be output at an output of microcontroller 18 (for example, via a bus).

For example, microcontroller 18 may switch to a predefined (safe) operating state or place a process controlled by microcontroller 18 or a system controlled by microcontroller 18 into a (safe) stable state. It is understood that the check of whether the deviation of derived signals S1, S2 from each other lies within tolerance range TOL may also take place with the aid of microcontroller 18 if comparator circuit 20 outputs e.g. differential voltage DIFF instead of output signal SA, or if microcontroller 18 (as part of comparator circuit 20) reads in first signal S1 and second signal S2 (or a digitized first signal and a digitized second signal) and compares them in a software-based manner.

Figure 2:
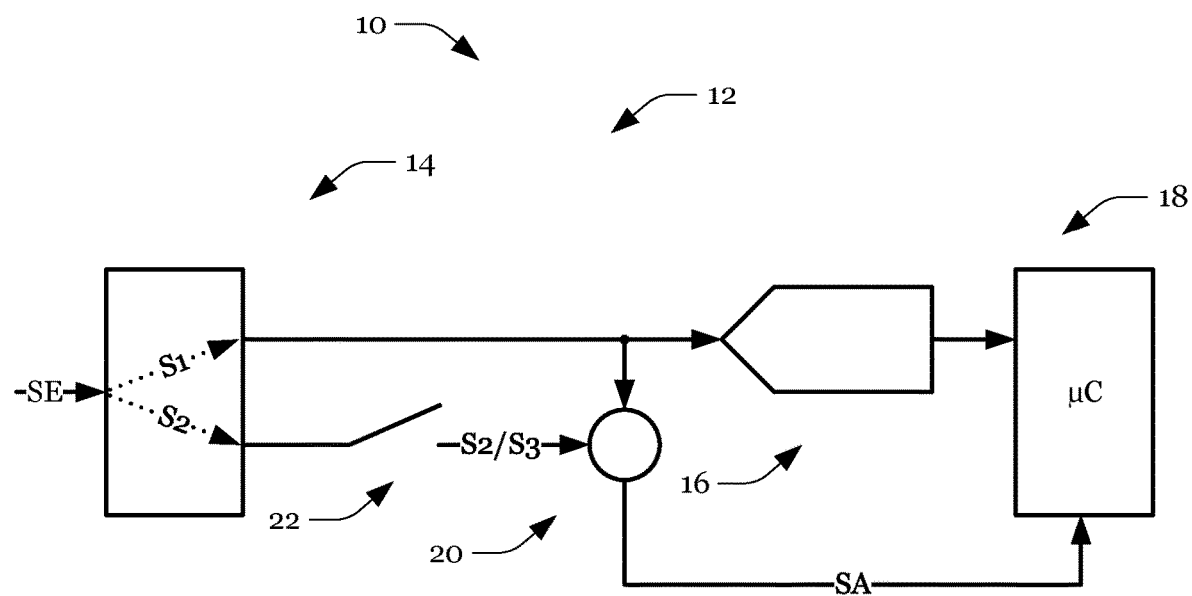
FIG. 2 shows a modification of the switching circuit illustrated in FIG. 1 for generating a defined error state.

FIG. 2 shows a modification of switching circuit 12 illustrated in FIG. 1 for generating a defined error state. For this purpose, the signal path via which second signal S2 is transmitted to comparator circuit 20 is provided with a switching element 22 (e.g. a semiconductor switch, such as a transistor), which makes it possible to interrupt the transmission of second signal S2 to comparator circuit 20. This makes it possible to bring about the case illustrated in FIG. 1a (due to a targeted driving of switching element 22).

By opening switching element 22, a third signal S3, which is independent of input signal SE (for example, a constant voltage, which lies outside the value range expected for the voltage representing second signal S2, is transmitted instead of second signal S2 to comparator circuit 20, and comparator circuit 20 or the error identifier is checked by microcontroller 18. Of course, it is understood that a targeted modification of the derivation of second signal S2 may take place instead of the interruption of the transmission of second signal S2 to comparator circuit 20, so that third signal S3 is not independent on input signal SE but has the dependency (on input signal SE) expected of second signal S2.

For example, if the transmission of second signal S2 to comparator circuit 20 is interrupted by a corresponding control signal during ongoing operation, of if the derivation of second signal S2 is disturbed/modified in a targeted manner, this makes it possible to check whether comparator circuit 20 detects the error or output signal SA indicates the artificially generated error. If the artificially generated error is not indicated, the generation of the error signal, for example with the aid of a checking circuit (not illustrated), may be triggered to indicate that circuit 10 does not operated without errors.

Figure 3:
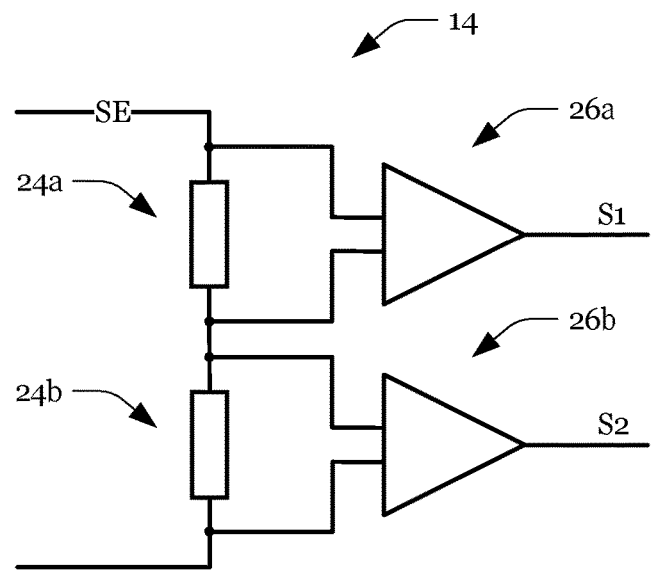
FIG. 3 shows an exemplary embodiment of the analog input circuit of the switching circuit illustrated in FIG. 1.

FIG. 3 shows a possible embodiment of analog input circuit 14 of switching circuit 12. Analog input circuit 14 comprises a first resistor 24a and a second resistor 24b, at which an input voltage representing input signal SE drops. The voltages dropping at resistors 24a, 24b are tapped and each supplied to an amplifier 26a, 26b, which amplifies the tapped voltage and outputs first signal S1 or second signal S2. Due to the ratio of resistors 24a, 24b (R1/R2) and the ratio of amplification factors (V1/V2), (approximately) identical signals S1, S2 as well as signals S1, S2 which differ from each other may be generated.

For example, (approximately) identical signals S1, S2 may be generated by resistors 24a, 24b of (approximately) the same size and amplification factors of (approximately) the same size. Likewise, (approximately) identical signals S1, S2 may be generated by resistors 24a, 24b of different sizes and amplification factors of correspondingly unequal size (e.g. by R1/R2=V2/V1). If the voltages representing signals S1, S2 differ by a certain factor, this may also be taken into account by correspondingly designing comparator circuit 20 or through the definition of tolerance range TOL.

Figure 4:
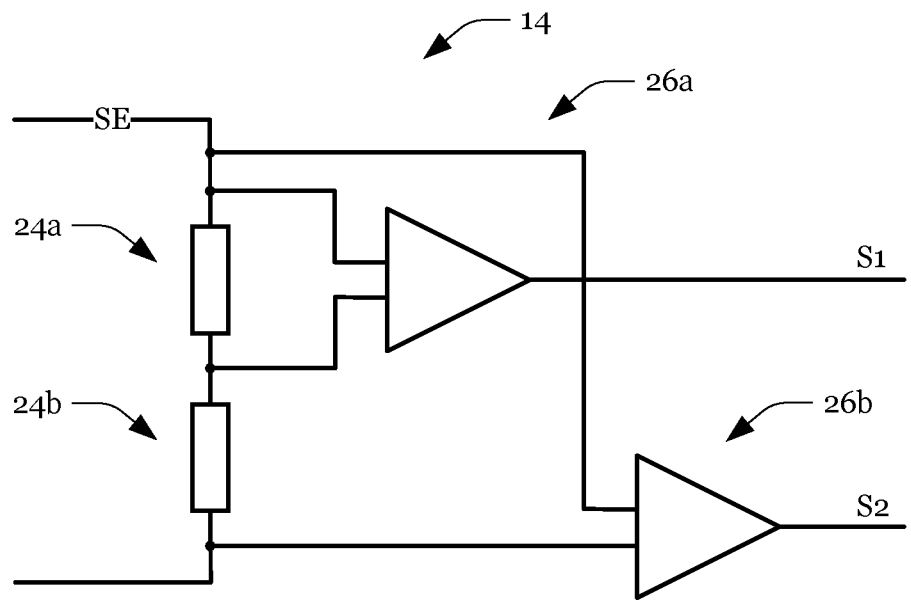
FIG. 4 shows an exemplary embodiment of the analog input circuit of the switching circuit illustrated in FIG. 1.

FIG. 4 shows another possible embodiment of analog input circuit 14 of switching circuit 12, which differs from the embodiment illustrated in FIG. 3 in that, in addition to the voltage dropping over first resistor 24a, the input voltage dropping over the two resistors 24a, 24b is tapped and supplied to an amplifier 26a, 26b in each case, which amplifies the tapped voltage and outputs first signal S1 or second signal S2. (Approximately) identical signals S1, S2 may then be achieved by correspondingly dimensioning the amplification factors of amplifier 26a, 26b, for example V2/V1=(R1+R2)/R2. For example, if resistors 24a, 24b are of the same design, (approximately) identical signals S1, S2 may be achieved in that second signal S2 is amplified by an amplification factor which is half as great as the amplification factor of first amplifier 26a.

Figure 5:
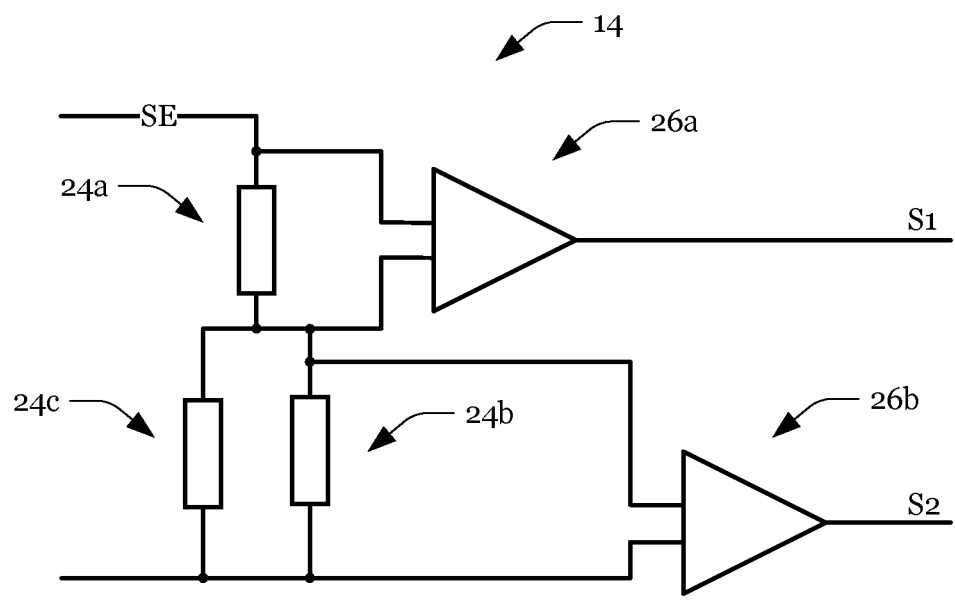
FIG. 5 shows an exemplary embodiment of the analog input circuit of the switching circuit illustrated in FIG. 1.

FIG. 5 shows another possible embodiment of analog input circuit 14 of switching circuit 12, which differs from the embodiment illustrated in FIG. 3 in that a third resistor 24c is connected in parallel to second resistor 24b. As a result, (approximately) identical signals S1, S2 may be generated even if resistors 24a, 24b of unequal size and amplification factors of equal size or resistors 24a, 24b of equal size and amplification factors of unequal size are present. In addition, second parallel-connected resistor 24c offers safety advantages, because resistors 24a and 24b/c may be subjected to different loads, for example in the case of an overcurrent, and the generation of the error signal may be effectuated thereby due to the variable behavior of resistors 24a, 24b, 24c in the case of an overcurrent.

Figure 6:
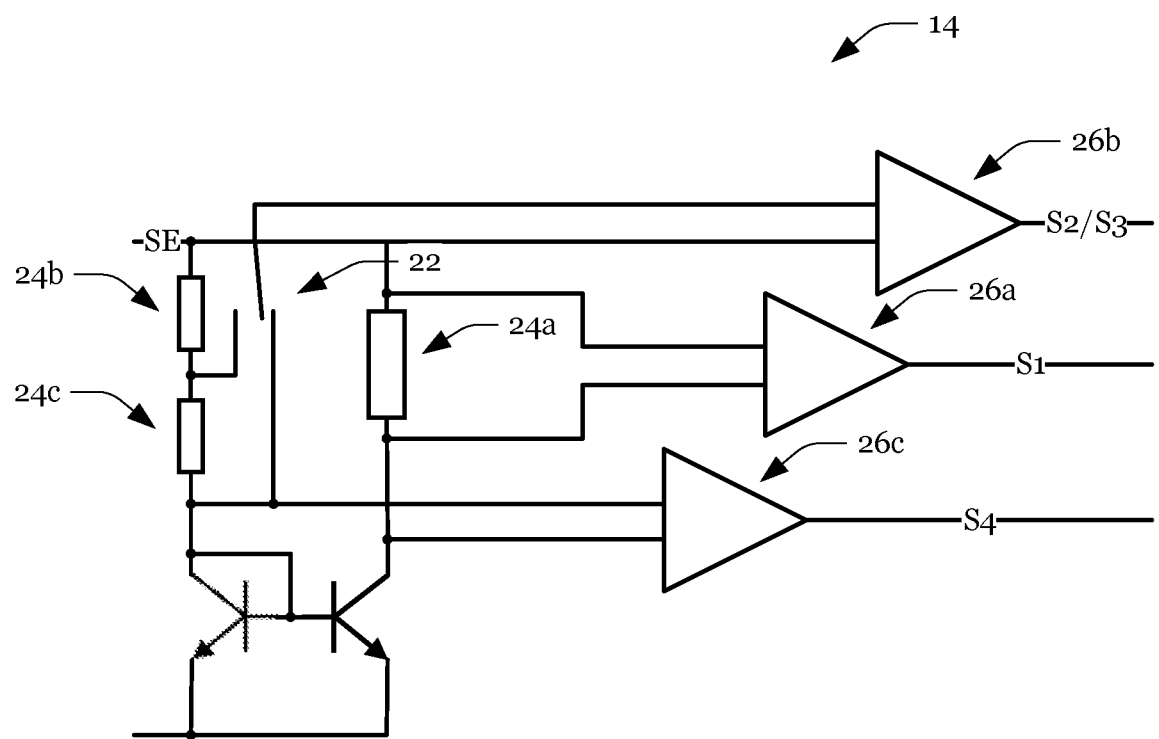
FIG. 6 shows an exemplary embodiment of the analog input circuit of the switching circuit illustrated in FIG. 1.

FIG. 6 shows another possible embodiment of analog input circuit 14 of switching circuit 12 illustrated in FIG. 1, which differs from the embodiment illustrated in FIG. 3 in that first signal S1 and second signal S2 are tapped at resistors in parallel current paths, the parallel current paths being connected to a current mirror, so that the currents flowing through the current paths are in a fixed ratio to each other (for example 1:1). In addition, as illustrated in FIG. 6, a fourth signal S4 may be generated to detect differences between the resistors in the current paths. If the voltage representing fourth signal S4 lies outside an acceptable range, a fault or an error in resistors 24a through 24c or in the leads between resistors 24a through 24c may be inferred.

In addition, analog input circuit 14 illustrated in FIG. 6 comprises a switching element 22, with the aid of which a third signal S3 may be output instead of second signal S2, which is not independent of input signal SE but differs from second signal S2. One of the parallel current paths thus includes multiple resistors, second signal S2 and third signal S3 being tapped via a different number of resistors. The voltage representing third signal S3 therefore differs from the voltage representing second signal S2 by a certain factor (e.g. 0.5 or 2).

Figure 7:
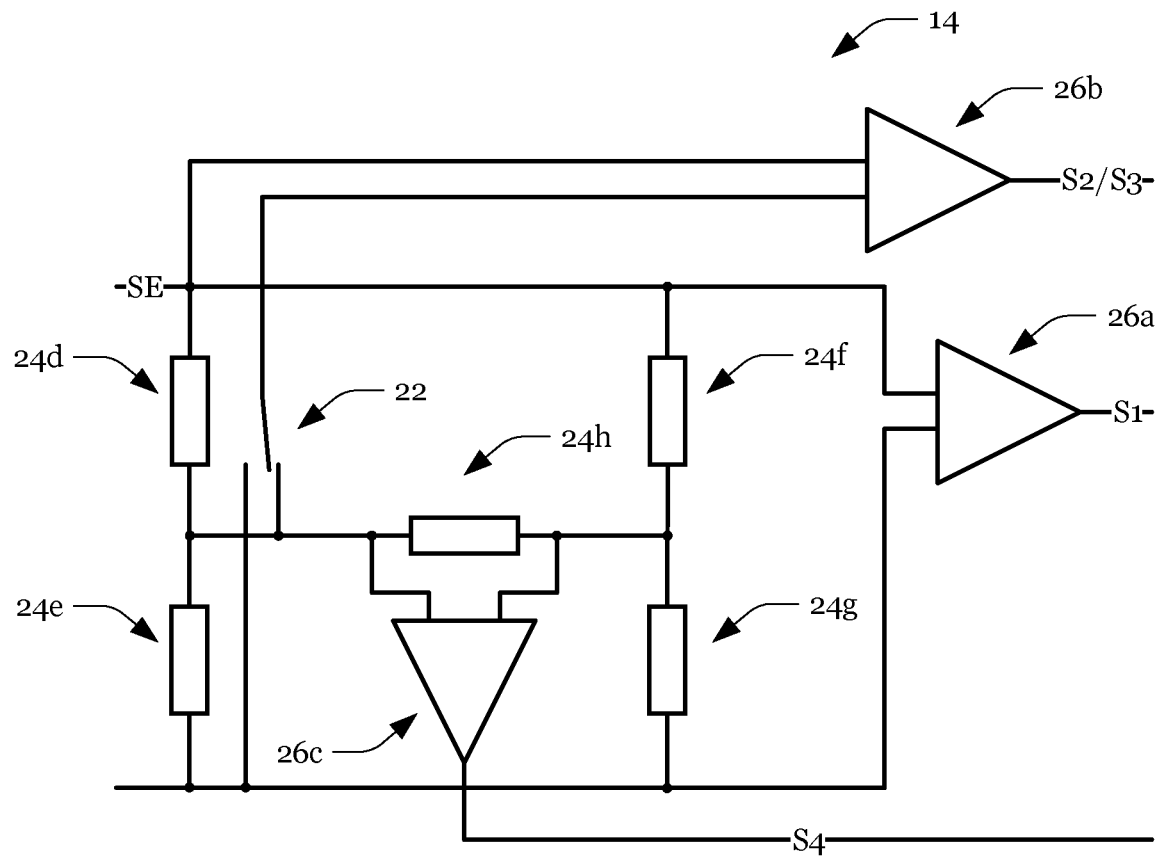
FIG. 7 shows an exemplary embodiment of the analog input circuit of the switching circuit illustrated in FIG. 1.

FIG. 7 shows another possible embodiment of analog input circuit 14 of switching circuit 12, which differs from the circuit illustrated in FIG. 6 in that the parallel current paths are designed in the form of a bridge circuit, which includes two resistors 24d, 24f and 24e, 24g of the same size in each case, the voltage dropping over resistor 24h disposed in the bridge branch being output as fourth signal S4 (after an optional amplification by amplifier 26), and the voltage representing fourth signal S4 being able to be used to detect differences between the resistors in the current paths. If the voltage representing fourth signal S4 lies outside an acceptable range, a fault or an error in resistors 24d through 24g or in the leads between resistors 24d through 24g may be inferred.

Figure 8:
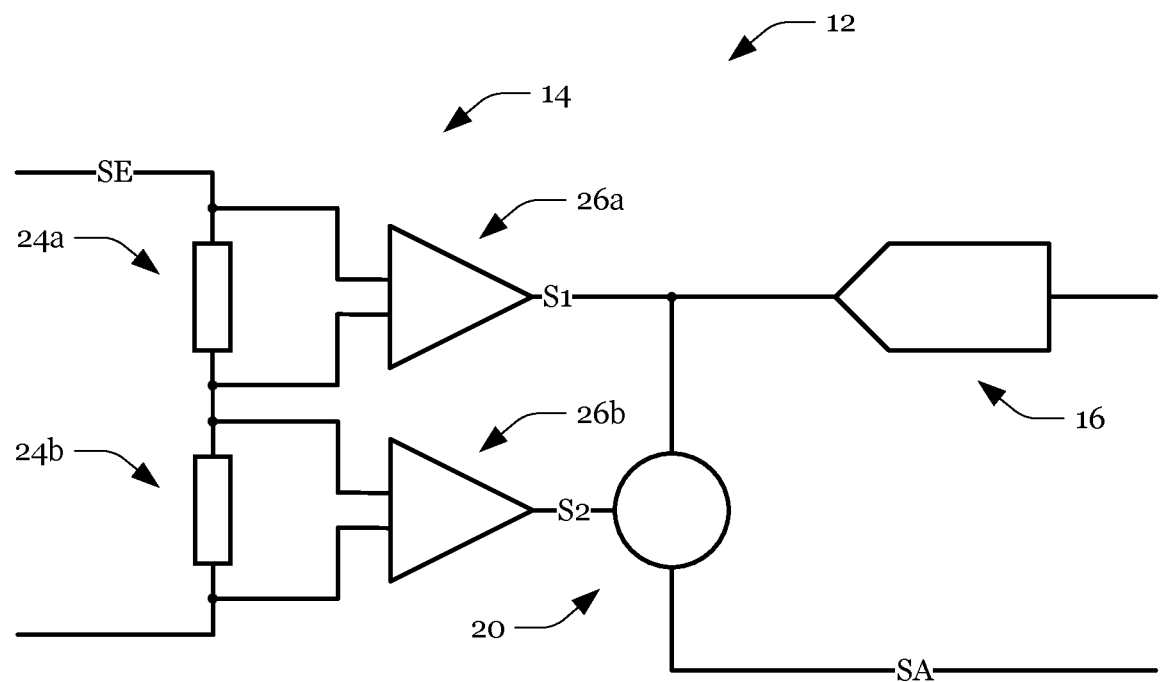
FIG. 8 shows an exemplary embodiment of the switching circuit illustrated in FIG. 1.

FIG. 8 shows a possible embodiment of switching circuit 12 illustrated in FIG. 1, which comprises input circuit 14 illustrated in FIG. 3. Comparator circuit 20 generates, for example, an output signal SA, which corresponds to difference DIFF between the voltage representing first signal S1 and the voltage representing the second signal, or, as illustrated in FIG. 1a, indicates whether differential voltage DIFF lies within our outside tolerance range TOL.

Figure 9:
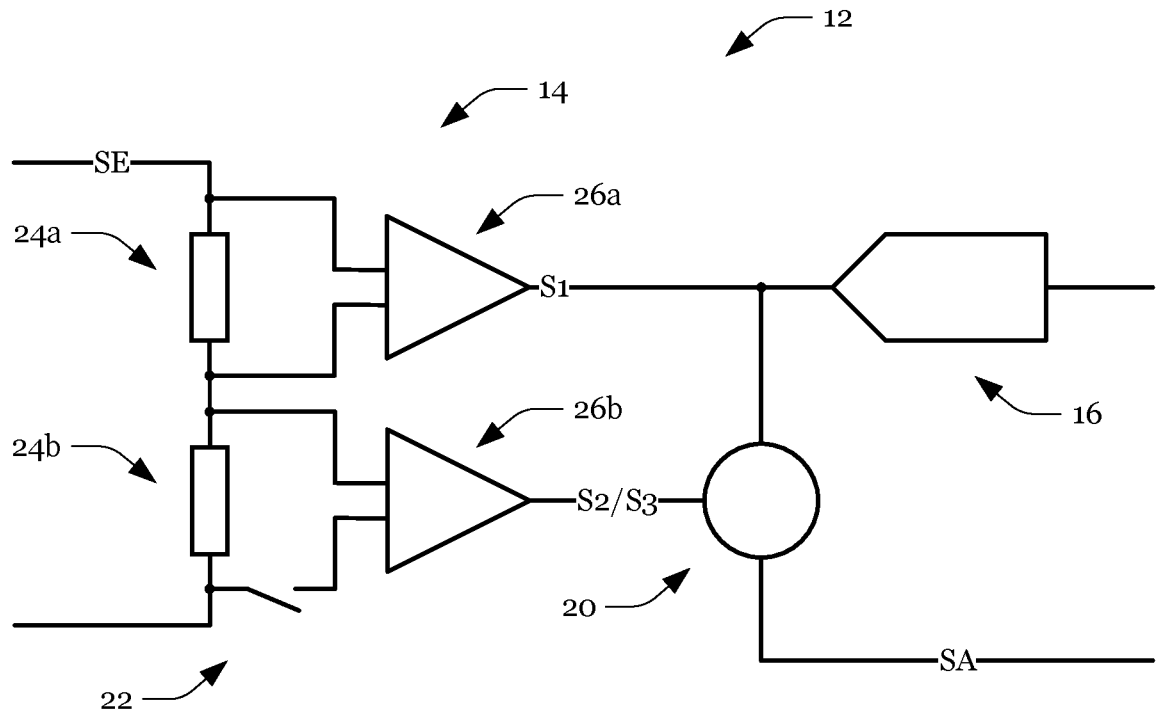
FIG. 9 shows an exemplary embodiment of the switching circuit illustrated in FIG. 2.

FIG. 9 shows a possible embodiment of switching circuit 12 illustrated in FIG. 2, which comprises input circuit 14 illustrated in FIG. 3. Switching element 22 is integrated into input circuit 14 in such a way that second signal S2 is no longer derived from the input voltage when switching element 22 is open. As a result, the dependency existing between first signal S1 and second signal S2 when switching element 22 is closed is eliminated, whereby correspondingly high differential voltages DIFF occur at high input voltages, and the deviation between derived signals S1, S2 lies outside tolerance range TOL.

Figure 10:
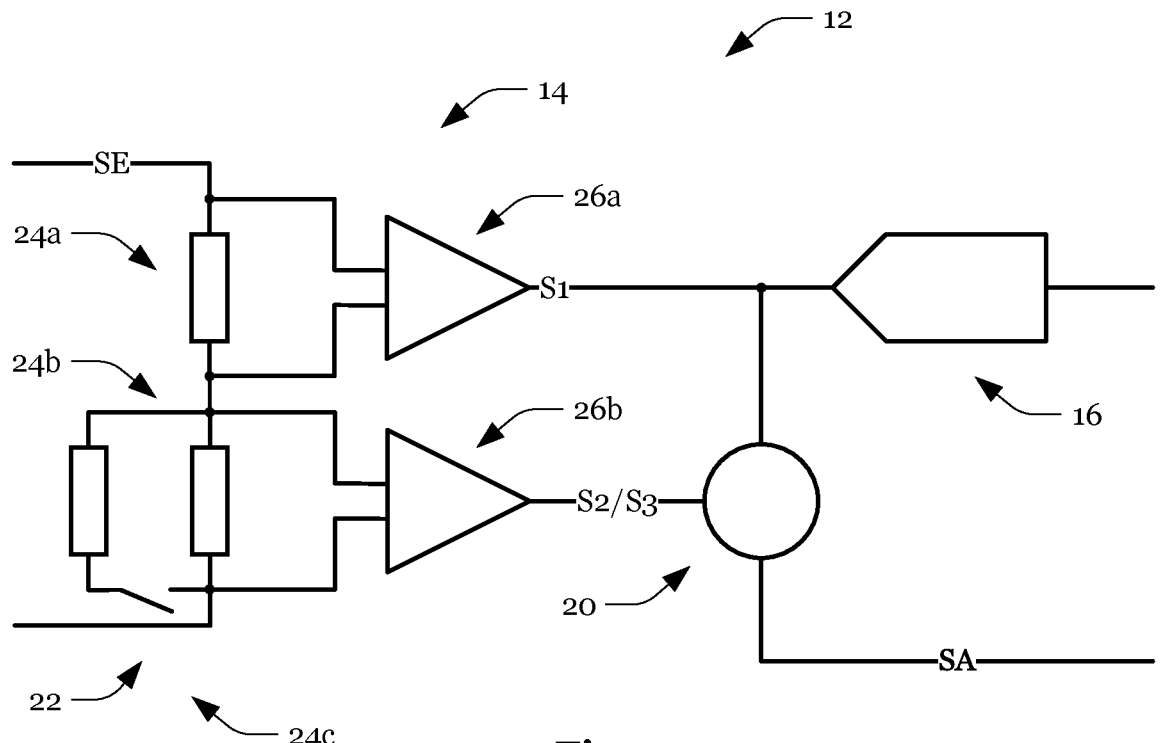
FIG. 10 shows a modification of the embodiment illustrated in FIG. 9.

FIG. 10 shows a modification of switching circuit 12 illustrated in FIG. 9, third signal S3 is generated by a targeted modification of the derivation of second signal S2 instead of generating a third signal S3 which is independent of the input signal, so that third signal S3 is not independent of input signal SE but does not have the dependency (on input signal SE) expected of second signal S2. As illustrated in FIG. 10, a third resistor 24c is connected in parallel to second resistor 24b by closing switching element 22 (similarly to the embodiment in FIG. 5), and the voltage tapped at second resistor 24b is modified thereby.

Figure 11:
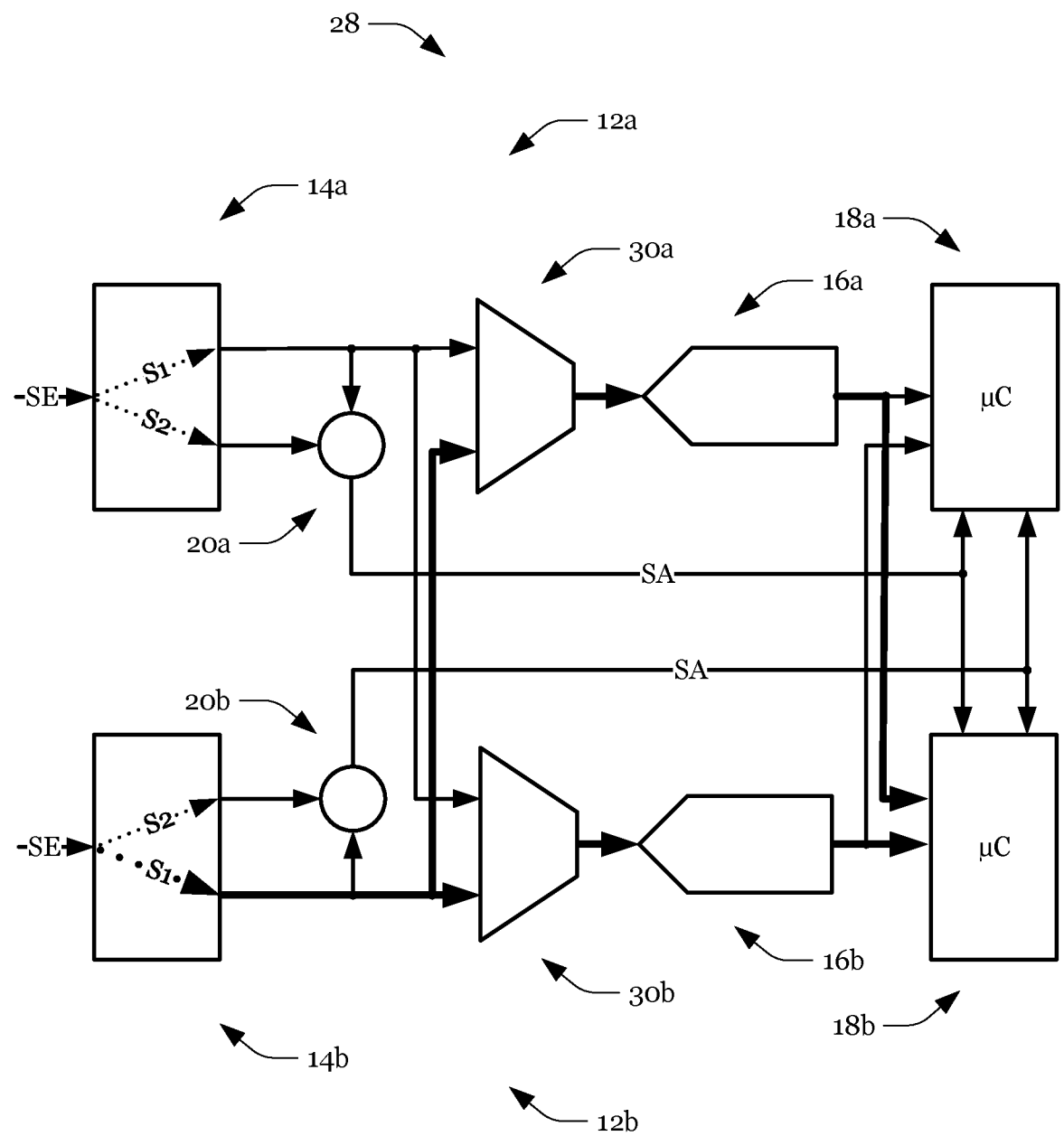
FIG. 11 shows a system, including two of the circuits illustrated in FIG. 1 and additional selection circuits for checking the A/D converter.

FIG. 11 shows a system 28 comprising circuits 10 illustrated in FIG. 1 for providing redundant transmission channels, an additional selection circuit 30a/30b being connected upstream from A/D converter 16a/16b in each of circuits 10. Selection circuits 30a/30b receive first signals S2 of the two circuits 10 on the input side and input a selected first signal S1 into particular A/D converter 16a/16b on the output side. By inputting the same first signal S1 into both A/D converters 16a/16b, it is possible, as clarified by the emphasized signal paths in FIG. 10, to check A/D converters 16a/16b by comparing the digitized signals.

For this purpose, both A/D converters 16a/16b are connected to both microcontrollers 18a/18b on the output side, so that microcontrollers 18a/18b may read in the output digitized data of both A/D converters 16a/16b. The read-in digitized data may then be checked to see whether a deviation of the digitized data from each other lies within a tolerance range.

Figure 12:
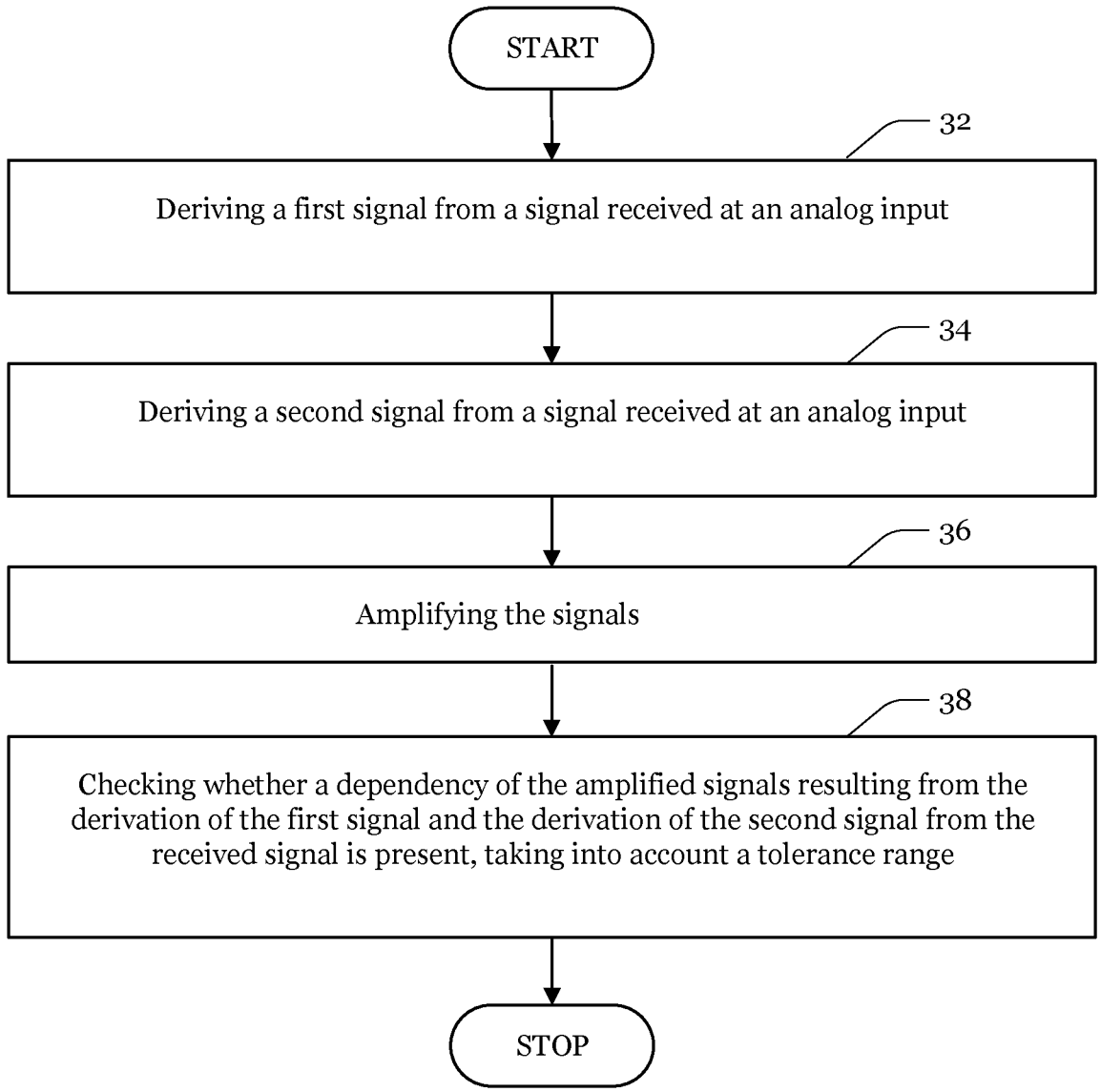
FIG. 12 shows a flow chart of a process for digitizing a signal received at an analog input.

FIG. 12 shows a flow chart of a process for digitizing a signal received at an analog input. The process begins with steps 32, 34 of deriving first signal S1 from signal SE received at the analog input and deriving second signal S2 from signal SE received at the analog input, as well as with the step of amplifying first signal S1 and amplifying second signal S2. The process then continues with step 38 of checking whether the dependency of the amplified signals resulting from the derivation of first signal S1 and the derivation of second signal S2 from received signal SE is present, taking into account tolerance range TOL. If the dependency of the amplified signals is not present, an error signal may be generated, as described above.

It is understood that all features of the switching circuits described above may also be features of preferred specific embodiments of the process, which relates to the use of switching circuit 12 to check an analog input circuit 14 of an A/D converter 16, switching circuit 12 comprising analog input circuit 14 and a comparator circuit 20, and analog input circuit 14 being configured to generate a first derived signal S1 and a second derived signal S2 from analog input signal SE of analog input circuit 14.

As described above, first derived signal S1 and second derived signal S2 are input signals for comparator circuit 20; however, only first derived signal S1 is an input signal for A/D converter 16. Comparator circuit 29 may then check whether a deviation of derived signals S1, S2 from each other lies within tolerance range TOL and output a output signal SA depending on the check, which may be further evaluated (for example by a microcontroller 18 or a higher level controller).

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A switching circuit for checking an analog input circuit of an A/D converter, comprising:
   an analog input circuit configured to generate a first derived signal and a second derived signal from an analog input signal of the analog input circuit; and
   a comparator circuit,
   wherein only the first derived signal is an input signal for the A/D converter,
   wherein the first derived signal and the second derived signal are input signals for the comparator circuit, and
   wherein the comparator circuit is configured to check whether a deviation of the derived signals from each other lies within tolerance range and to output an output signal based on the check, which is capable of being further evaluated.

2. The switching circuit according to claim 1, wherein the switching circuit includes a switching element to change or deactivate the second derived signal in a targeted manner by closing or opening the switching element generates a defined error state.

3. The switching circuit according to claim 1, wherein the comparator circuit is configured to derive a difference signal from the first derived signal and the second derived signal, and wherein the tolerance range specifies a value range for the difference signal.

4. The switching circuit according to claim 1, wherein the analog input circuit is configured to derive the first derived signal from a voltage drop at a first resistor and to derive the second derived signal from a voltage drop at a second resistor, wherein the first resistor and the second resistor are connected in series to an analog input of the input circuit.

5. The switching circuit according to claim 1, wherein the analog input circuit comprises a first amplifier and a second amplifier, wherein the first derived signal is an output signal of the first amplifier, and wherein the second derived signal is an output signal of the second amplifier.

6. A system comprising:
   a first switching circuit; and
   a second switching circuit, the first and second switching circuits being a circuit, comprising:
   an analog input circuit configured to generate a first derived signal and a second derived signal from an analog input signal of the analog input circuit; and
   a comparator circuit,
   wherein only the first derived signal is an input signal for an A/D converter,
   wherein the first derived signal and the second derived signal are input signals for the comparator circuit,
   wherein the comparator circuit is configured to check whether a deviation of the derived signals from each other lies within tolerance range and to output an output signal based on the check,
   wherein the first switching circuit comprises a first selection circuit, and the second switching circuit comprises a second selection circuit,
   wherein the first selection circuit is configured to transmit the first derived signal of the first switching circuit or the first derived signal of the second switching circuit to the A/D converter of the first switching circuit,
   wherein the second selection circuit is configured to transmit the first derived signal of the first switching circuit or the first derived signal of the second switching circuit to the A/D converter of the second switching circuit, and
   wherein the system is configured to check whether the signals digitized by the A/D converter are identical or whether a deviation of the digitized signals from each other lies within an acceptance range when the selection circuits transmit the first derived signal of the first switching circuit or the first derived signal of the second switching circuit to the A/D converter.

7. A method for digitizing a signal received at an analog input, the method comprising:
   deriving a first signal from the signal received at the analog input;
   deriving a second signal from the signal received at the analog input;
   amplifying the first signal;
   amplifying the second signal;
   digitizing the amplified first signal;
   checking whether an expected dependency of the amplified signals resulting from the derivation of the first signal and the derivation of the second signal from the received signal is present, taking into account a tolerance range; and
   generating an error signal if the dependency of the amplified signals is not present.

8. The method according to claim 7, further comprising:
   amplifying a third signal, which is independent of the signal received at the analog input or is generated with the aid of a targeted amplification of the derivation of the second signal; and
   checking whether a deviation between the amplified first signal and the amplified third signal lies outside the tolerance range.

9. The method according to claim 8, further comprising:
   generating the error signal if the deviation between the amplified first signal and the amplified third signal lies within the tolerance range.

10. The method according to claim 7, further comprising:
    deriving a difference signal from the amplified first signal and the amplified second signal, the tolerance range specifying a value range for the difference signal.

11. The switching circuit according to claim 1, wherein a microcontroller receives a digitized output of the A/D converter and the output signal of the comparator circuit.

12. The switching circuit according to claim 11, wherein the microcontroller outputs an error signal based on the output signal of the comparator circuit.

13. The method according to claim 7, wherein a microcontroller generates the error signal and the microcontroller switches to a predefined state based on a result of the checking.

14. The system according to claim 6, wherein the first switching circuit or the second switching circuit include a switching element to change or deactivate the second derived signal of the first switching circuit or the second switching circuit in a targeted manner by closing or opening the switching element in order to generate a defined error state.

* * * * *